United States Patent
Hwang (10) Patent No.: US 8,338,910 B2
(45) Date of Patent: Dec. 25, 2012

(54) SEMICONDUCTOR MEMORY DEVICES HAVING STRAIN LAYERS THEREIN THAT IMPROVED DEVICE PERFORMANCE

(75) Inventor: Young-nam Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 13/073,623

(22) Filed: Mar. 28, 2011

(65) Prior Publication Data

US 2011/0254103 A1    Oct. 20, 2011

(30) Foreign Application Priority Data

Apr. 20, 2010    (KR) .................. 10-2010-0036497

(51) Int. Cl.
*H01L 21/70*    (2006.01)
(52) U.S. Cl. .......... 257/506; 257/E27.098; 257/E27.081
(58) Field of Classification Search .............. 257/4, 369, 257/E27.098, 499, 506, E27.081
See application file for complete search history.

(56) References Cited

U.S. PATENT DOCUMENTS

| | | | |
|---|---|---|---|
| 2004/0029323 A1* | 2/2004 | Shimizu et al. | ............... 438/142 |
| 2006/0255365 A1 | 11/2006 | Ko et al. | |
| 2009/0242944 A1 | 10/2009 | Zhang et al. | |
| 2010/0078622 A1* | 4/2010 | Yoshimizu et al. | ............... 257/4 |
| 2010/0090286 A1* | 4/2010 | Lee et al. | ............... 257/368 |

FOREIGN PATENT DOCUMENTS

| | | |
|---|---|---|
| JP | 2005-005633 | 1/2005 |
| JP | 2007-005626 | 1/2007 |
| KR | 1020080073212 A | 8/2008 |

OTHER PUBLICATIONS

Shimizu et al., "Local Mechanical-Stress Control . . .", 2001, IEDM, 01-433, pp. 19.4.1-19.4.4.*

* cited by examiner

*Primary Examiner* — Thomas L Dickey
*Assistant Examiner* — Nikolay Yushin
(74) *Attorney, Agent, or Firm* — Myers Bigel Sibley & Sajovec, P.A.

(57) ABSTRACT

Integrated circuit memory devices include a semiconductor word line having an electrically insulating strain layer directly contacting an upper surface thereof. The strain layer, which has a contact opening therein, has a sufficiently high degree of internal compressive strain therein to thereby impart a net tensile stress within at least a first portion of the semiconductor word line. A P-N junction diode is also provided on the semiconductor word line. The diode includes a first terminal (e.g., cathode, anode) electrically coupled through the opening in the strain layer to the surface of the semiconductor word line. A data storage element (e.g., MRAM, FRAM, PRAM, RRAM, etc.) may also be provided, which has a current carrying terminal electrically coupled to a second terminal of the p-n junction diode.

16 Claims, 8 Drawing Sheets

SEMICONDUCTOR MEMORY DEVICES HAVING STRAIN LAYERS THEREIN THAT IMPROVED DEVICE PERFORMANCE

REFERENCE TO PRIORITY APPLICATION

This application claims priority to Korean Patent Application No. 10-2010-0036497, filed Apr. 20, 2010, the disclosure of which is hereby incorporated herein in its entirety by reference.

FIELD

This invention relates to semiconductor devices and methods of manufacturing the same and, more particularly, to semiconductor memory devices and methods of manufacturing the same.

BACKGROUND

Much research into magnetic random access memory (MRAM), ferroelectric random access memory (FRAM), phase-change random access memory (PRAM), resistive random access memory (RRAM), etc., in addition to conventional dynamic random access memory (DRAM) or flash memory, has been recently conducted. The above types of memory may use diodes as switching devices. In this regard, a method of further increasing memory integration needs to be improved.

SUMMARY

Integrated circuit memory devices according to embodiments of the invention include nonvolatile memory devices. These nonvolatile memory devices may include a semiconductor word line having an electrically insulating strain layer directly contacting an upper surface thereof. The strain layer, which has a contact opening therein, has a sufficiently high degree of internal compressive strain therein to thereby impart a net tensile stress within at least a first portion of the semiconductor word line. A P-N junction diode is also provided on the semiconductor word line. In particular, the diode includes a first terminal (e.g., cathode, anode) electrically coupled through the opening in the strain layer to the surface of the semiconductor word line. A data storage element (e.g., MRAM, FRAM, PRAM, RRAM, etc.) may also be provided, which has a current carrying terminal electrically coupled to a second terminal of the p-n junction diode.

According to some embodiments of the invention, the strain layer imparts a sufficiently high tensile stress within the first portion of the semiconductor word line to thereby increase a conductivity of the first portion of the semiconductor word line. In particular, the conductivity of the semiconductor word line may be increased by at least 5% relative to an otherwise equivalent semiconductor word line that is free of the tensile stress imparted by the strain layer. According to additional embodiments of the invention, the semiconductor word line is disposed within a semiconductor substrate, between first and second electrically insulating trench isolation regions that contact opposing sides of the semiconductor word line. According to these embodiments of the invention, the strain layer contacts and imparts a net tensile stress within first and second portions of the first and second electrically insulating trench isolation regions, respectively. The strain layer may be a silicon nitride layer having a thickness in a range from 50 Å to 1000 Å.

According to additional embodiments of the invention, PMOS and NMOS transistors are provided in a peripheral circuit portion of the substrate. In particular, the PMOS transistor may have source and drain regions within the semiconductor substrate and the strain layer may also cover the PMOS transistor, to thereby impart a net tensile stress within a channel region of the PMOS transistor. This strain layer may contact the source and drain regions at a surface of the semiconductor substrate. In addition, the NMOS transistor may have source and drain regions within the semiconductor substrate and a second strain layer may be provided, which covers the NMOS transistor. This second strain layer may have a sufficiently high degree of internal tensile strain therein to thereby impart a net compressive stress within a channel region of the NMOS transistor.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, the inventive concept will be described more fully with reference to the accompanying drawings, in which exemplary embodiments of the invention are shown. The inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art. It will be understood that when an element or layer is referred to as being "on" another element or layer, the element or layer may be directly on another element or layer or intervening elements or layers. In the drawings, the lengths and sizes of layers and regions may be exaggerated for clarity. Like numbers refer to like elements throughout. As used herein, the term "and/or" includes any and all combinations of one or more of the associated listed items.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms 'a', 'an', and 'the' are intended to include the plural forms as well, unless the context clearly indicates otherwise. It will be further understood that the terms "comprises' and/or 'comprising,' when used in this specification, specify the presence of stated features, integers, operations, elements, and/or components, but do not preclude the presence or addition of one or more other features, integers, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An embodiment of the inventive concept provides a semiconductor device including a plurality of word lines that extend in a first direction on a semiconductor substrate and are arranged in a second direction different from the first direction, a plurality of first insulation layers that insulate the word lines, a strained film formed on the word lines and the first insulation layers, a second insulation layer formed on the strained film, and a plurality of p-n junction diodes including a first impurity region and a second impurity region that have different conductive types and are arranged perpendicular to each other and electrically connected to the word lines through the strained film and the second insulation layer.

Figure 1:
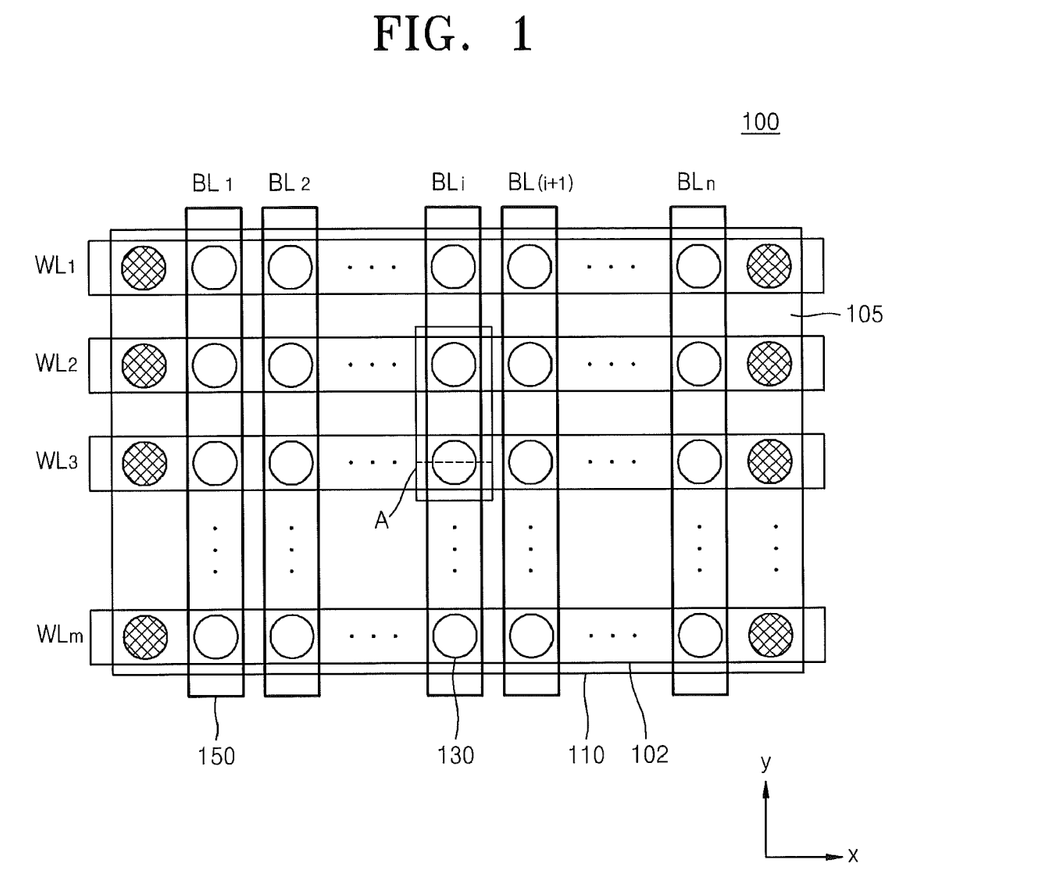
FIG. 1 is a layout diagram of a semiconductor device according to an embodiment of the inventive concept.

FIG. 1 illustrates a layout of a semiconductor device 100 according to an embodiment of the inventive concept. Referring to FIG. 1, a plurality of word lines $WL_1$, $WL_2$, $WL_3$, ..., $WL_m$ 102 extend in a first direction that is an x direction and are arranged in a second direction that is a y direction. Although the first direction and the second direction are perpendicular to each other in FIG. 1, the inventive concept is not limited thereto. The first direction and the second direction may be different from each other.

A plurality of bit lines $BL_1$, $BL_2$, $BL_i$, $BL_{(i+1)}$, ..., $BL_n$ 150 extend in the second direction, and each of them is connected to a plurality of p-n junction diodes 130. Although not shown, the semiconductor device 100 may include a plurality of storage elements corresponding to the respective p-n junction diodes 130. Furthermore, the semiconductor device 100 may further include a strained film 110 to apply a stress to the word lines $WL_1$, $WL_2$, $WL_3$, ..., $WL_m$ 102 in a horizontal direction, which will be explained later.

Figure 2:
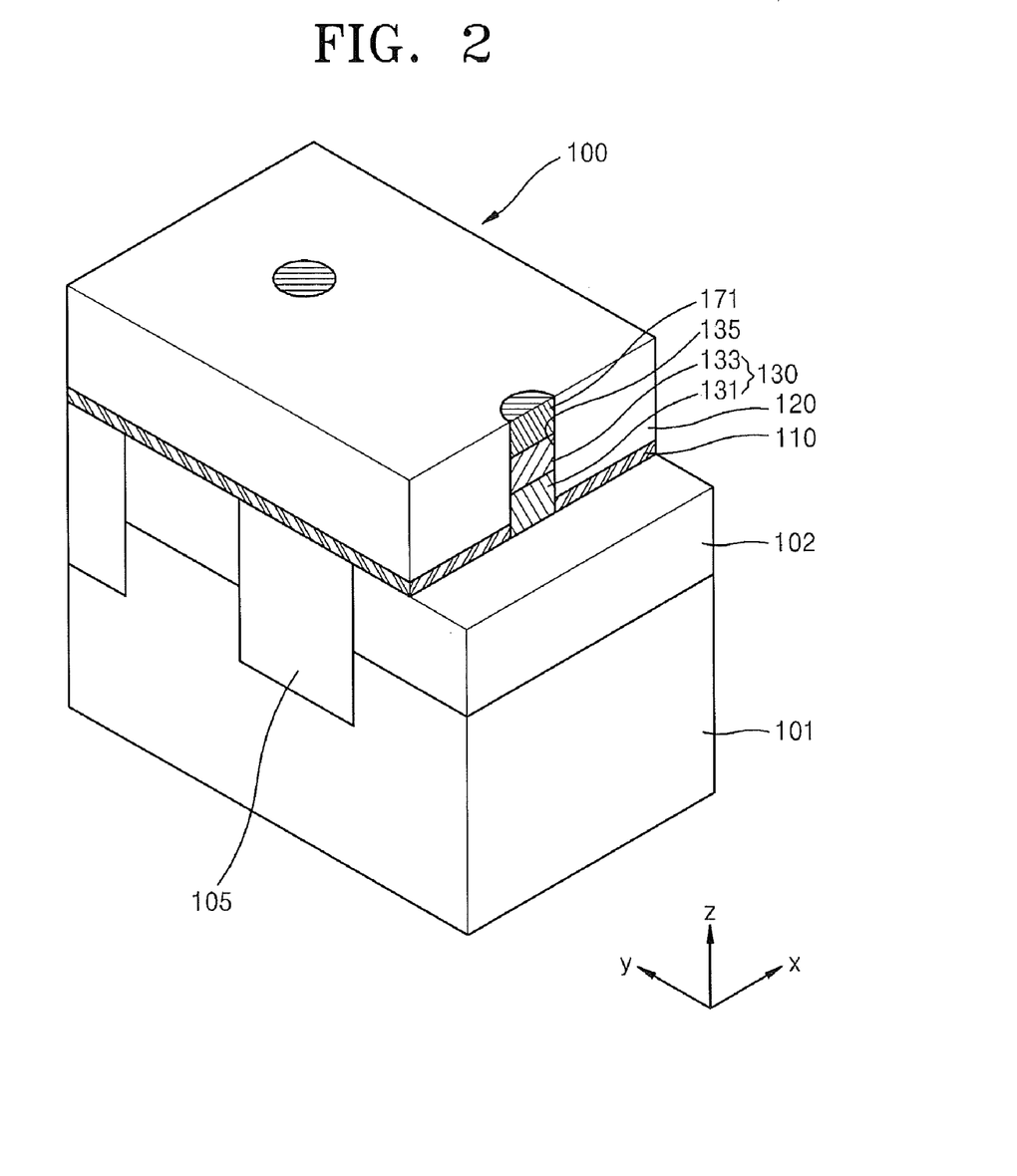
FIG. 2 is a perspective view of a portion A of the semiconductor device of FIG. 1.

FIG. 2 is a perspective view of a portion A of the semiconductor device 100 of FIG. 1. A dotted part of the portion A in FIG. 1 indicates an upper cut portion shown in FIG. 2. Referring to FIG. 2, the word lines $WL_1$, $WL_2$, $WL_3$, ..., $WL_m$ 102 are formed on an active region 101 of a semiconductor substrate, and are insulated from each other by a plurality of first insulation layers 105. The strained film 110 is formed on the word lines $WL_1$, $WL_2$, $WL_3$, ..., $WL_m$ 102 and the first insulation layers 105. The strained film 110 is used to apply a predetermined stress to surfaces of the word lines $WL_1$, $WL_2$, $WL_3$, ..., $WL_m$ 102 and the first insulation layers 105 in a horizontal direction. The active region 101 and the word lines $WL_1$, $WL_2$, $WL_3$, ..., $WL_m$ 102 may be doped to have opposite conductive types. In other words, the active region 101 may be doped to have p type conductivity and the word lines $WL_1$, $WL_2$, $WL_3$, ..., $WL_m$ 102 may be doped to have n type conductivity, or vice versa.

Figure 3:
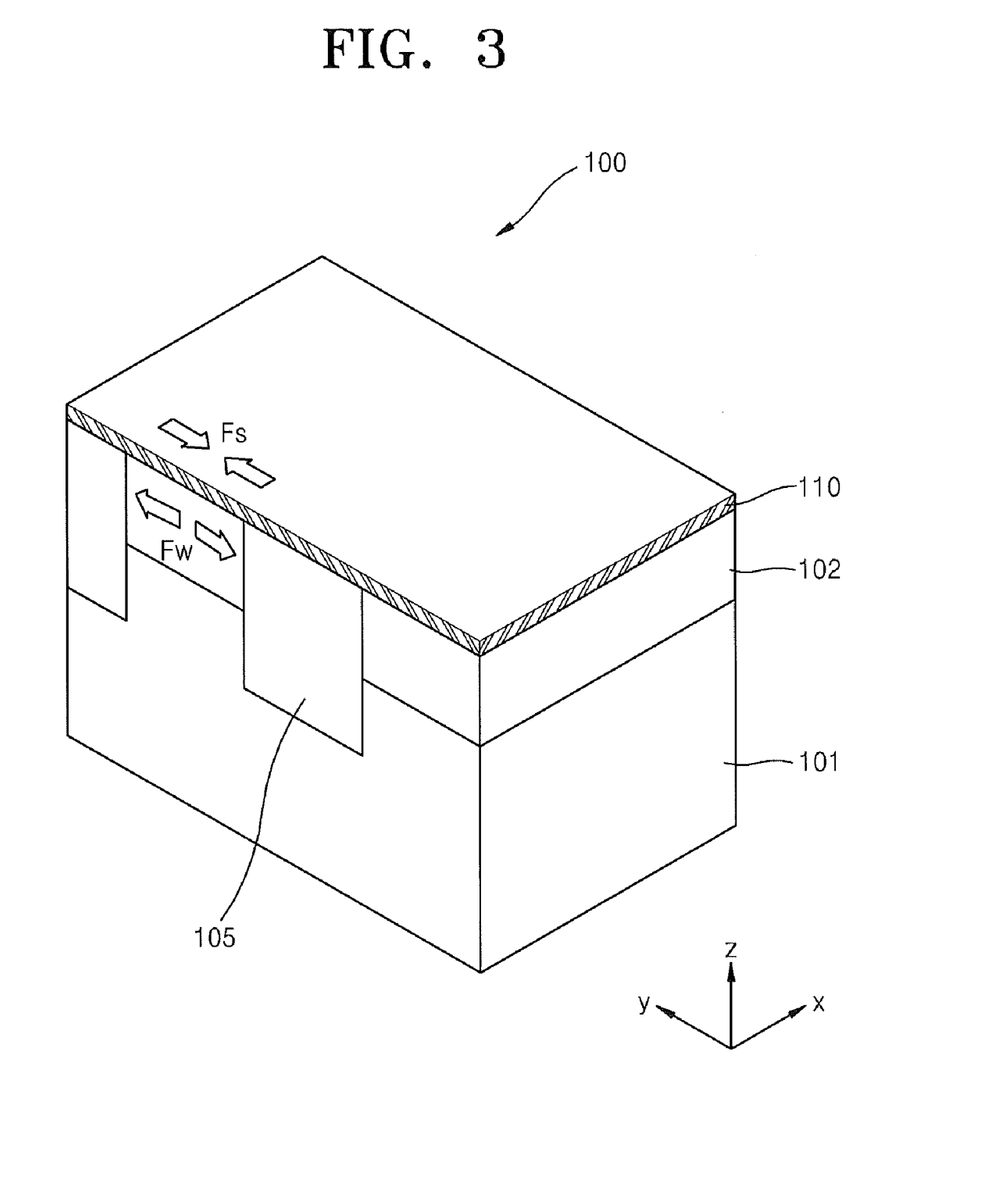
FIG. 3 is a perspective view for explaining the relationship between a strain of a strained layer and a stress generated on a layer formed beneath the strain layer.

More specifically, referring to FIG. 3 showing the relationship between a strain of a strained layer and a stress generated on a layer formed beneath the strain layer, if the strained film 110 is compressively strained and thus a compressive stress Fs is generated in the strained film 110, a tensile stress Fw is generated in the surfaces of the word lines $WL_1$, $WL_2$, $WL_3$, ..., $WL_m$ 102 and the first insulation layers 105 formed beneath the strained film 110. Mobility of electrons increases and mobility of holes deteriorate in the film where the tensile stress Fw is generated. To the contrary, mobility of holes increases and mobility of electrons deteriorate in the film where the compressive stress Fs is generated. If the word lines $WL_1$, $WL_2$, $WL_3$, ..., $WL_m$ 102 are doped with an n type dopant, since the tensile stress Fw is generated in the word lines $WL_1$, $WL_2$, $WL_3$, ..., $WL_m$ 102, mobility of electrons increases and thus surface resistances of the word lines $WL_1$, $WL_2$, $WL_3$, ..., $WL_m$ 102 may be greatly improved.

For example, the conductivity of the word lines may increase by at least about 5% and by as much as 80%. Although the strained film 110 is compressively strained and the tensile stress Fw is generated in the surfaces of the word lines $WL_1$, $WL_2$, $WL_3$, ..., $WL_m$ 102 and the first insulation layers 105 formed beneath the strained film 110 in FIG. 3, the inventive concept is not limited thereto. Contrary to FIG. 3, the strained film 110 is tensily strained and the compressive stress Fs may be generated in the surfaces of the word lines $WL_1$, $WL_2$, $WL_3$, ..., $WL_m$ 102 and the first insulation layers 105 formed beneath the strained film 110.

The strained film 110 may be, for example, silicon nitride. However, the inventive concept is not limited thereto. The thickness of the strained film 110 may be between 50 Å and 1000 Å. A thin strained film lacks mechanical hardness and may not sufficiently apply a tensile stress or a compressive stress to a lower portion thereof. A thick strained film is inconvenient for forming the p-n junction diodes 130 and is economically unfavorable.

Referring to FIG. 2, the p-n junction diodes 130 contact the word lines $WL_1$, $WL_2$, $WL_3$, ..., $WL_m$ 102 through the strained film 110 and are insulated from each other by a second insulation layer 120. The p-n junction diodes 130 may include a first impurity region 131 and a second impurity region 133 that have different conductive types and contact each other. The shapes of the p-n junction diodes 130 are not particularly limited thereto. The first impurity region 131 and the second impurity region 133 may be arranged perpendicular to each other in order to increase integration. The first impurity region 131 may be doped with a p type dopant and the second impurity region 133 may be doped with an n type dopant, or vice versa. A conductive type may be determined according to conductive types of the word lines $WL_1$, $WL_2$, $WL_3$, ..., $WL_m$ 102 disposed beneath the p-n junction diodes 130. In other words, the conductive type of the first impurity region 131 that directly contacts the word lines $WL_1$, $WL_2$, $WL_3$, ..., $WL_m$ 102 disposed beneath the second impurity region 133 may be the same as that of the word lines $WL_1$, $WL_2$, $WL_3$, ..., $WL_m$ 102. However, a doping concentration of the first impurity region 131 may be different from that of the word lines $WL_1$, $WL_2$, $WL_3$, ..., $WL_m$ 102.

In addition, a conductive plug 171 may be further disposed on the upper portion of the second impurity region 133. The conductive plug 171 may be a metal plug having ohmic contact. For example, the conductive plug 171 may be a tungsten plug. In particular, when the conductive plug 171 is the tungsten plug, a barrier layer used to prevent the diffusion of the tungsten may be formed on the sidewall and bottom surfaces of the conductive plug 171. However, the conductive plug 171 is not essential to the semiconductor device 100. When the semiconductor device 100 does not include the conductive plug 171, a hole 135 may be fully filled with the p-n junction diodes 130.

Figure 4:
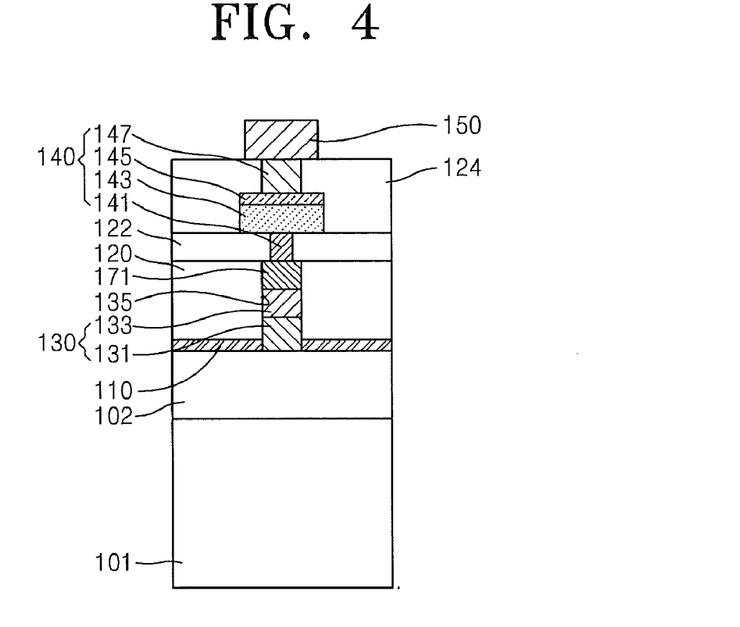
FIG. 4 is a cross-sectional view of the portion A of FIG. 1.

FIG. 4 is a cross-sectional view of the dotted part of the portion A of FIG. 1. Referring to FIG. 4, as described above, the word lines $WL_1, WL_2, WL_3, \ldots, WL_m$ 102 are formed on the active region 101 of the semiconductor substrate, the strained film 110 and the second insulation layer 120 are sequentially stacked on the upper portion of the word lines $WL_1, WL_2, WL_3, \ldots, WL_m$ 102, and the p-n junction diodes 130 and the conductive plug 171 are disposed in the hole 135 that passes through the strained film 110 and the second insulation layer 120.

A storage element 140 may be formed on the upper portion of the conductive plug 171. The storage element 140 may be one selected from the group consisting of magnetic random access memory (MRAM), ferroelectric random access memory (FRAM), phase-change random access memory (PRAM), and resistive random access memory (RRAM). Although the PRAM is described as the storage element 140 in the present embodiment of the inventive concept, the other storage elements may be used within the scope of the inventive concept.

In more detail, a third insulation layer 122 and a lower electrode 141 are formed on the upper portion of the conductive plug 171. The lower electrode 141 contacts the conductive plug 171. A fourth insulation layer 124 is formed on the third insulation layer 122. A phase-change material film 143, an upper electrode 145, and a bit line contact plug 147 are included in the storage element 140. The storage element 140 may include the lower electrode 141, the phase-change material film 143, the upper electrode 145, and the bit line contact plug 147. A bit line 150 may be formed on the upper portion of the bit line contact plug 147. The bit line 150 may extend in the second direction.

Figure 5:
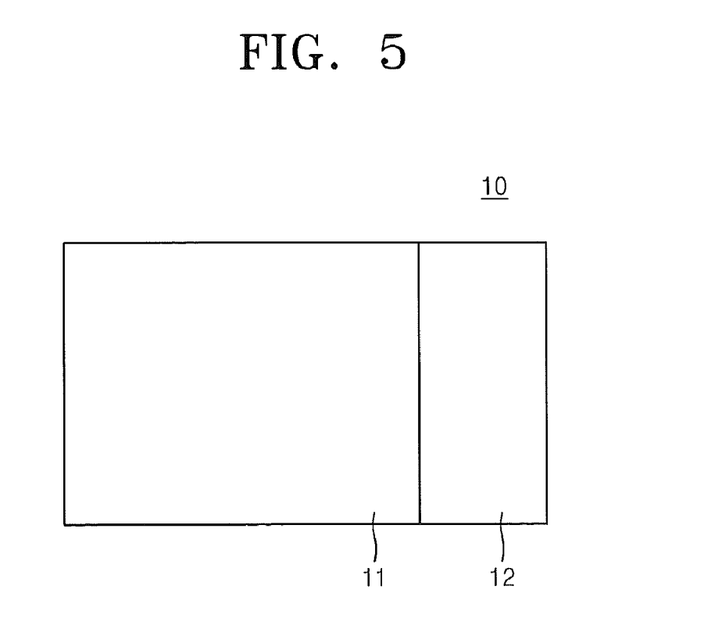
FIG. 5 is a schematic view of a semiconductor memory device according to an embodiment of the inventive concept.

According to another embodiment of the inventive concept, a semiconductor memory device includes a cell region including the semiconductor device 10 and a peripheral circuit region including an n-channel metal oxide semiconductor (NMOS) and/or a p-channel metal oxide semiconductor (PMOS). FIG. 5 is a schematic view of a semiconductor memory device 10 according to an embodiment of the inventive concept. Referring to FIG. 5, the semiconductor memory device 10 may include a cell region 11 and a peripheral circuit region 12. The peripheral circuit region 12 may be physically formed in a peripheral region of the cell region 11.

FIGS. 6 through 10 are cross-sectional views of a cell region and a peripheral circuit region of a semiconductor memory device according to embodiments of the inventive concept. An NMOS 210 and/or a PMOS 220 may be formed in the peripheral circuit region. In particular, the PMOS 220 may be formed on an n-well 101W. Although both the NMOS 210 and the PMOS 220 are formed in FIG. 6, only one of the NMOS 210 and the PMOS 220 may be formed, which also falls within the scope of invention.

Figure 6:
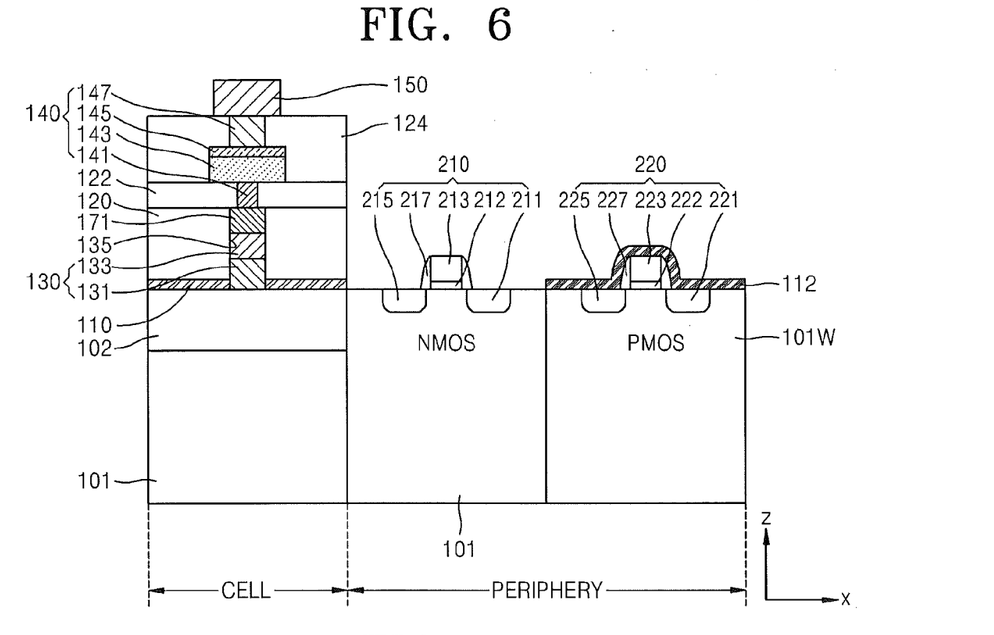
FIGS. 6 through 10 are cross-sectional views of a cell region and a peripheral circuit region of a semiconductor memory device, according to embodiments of the inventive concept.

Referring to FIG. 6, the NMOS 210 may include a source region 211, a drain region 215, a gate electrode 213, a gate insulation layer 212, and a spacer 217. The PMOS 220 may include a source region 221, a drain region 225, a gate electrode 223, a gate insulation layer 222, and a spacer 227. A surface of the PMOS 220, i.e., surfaces of the source region 221, the drain region 225, and the gate electrode 223 of the PMOS 220, may be covered with a compressively strained film 112. In particular, the compressively strained film 112 may be connected to the strained film 110 of the cell region. The compressively strained film 112 may cover surfaces of the source region 221, the drain region 225, and the gate electrode 223 of some PMOSs 220 among a plurality of PMOSs in the peripheral circuit region.

Figure 7:
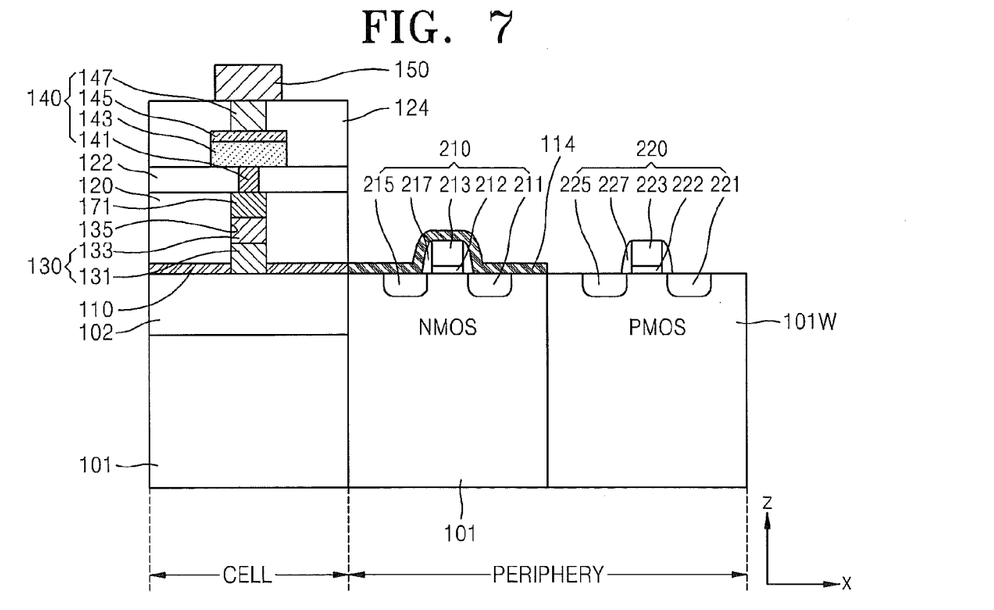

Alternatively, referring to FIG. 7, a surface of the NMOS 210 (i.e., surfaces of the source region 211, the drain region 215, and the gate electrode 213 of the NMOS 210), may be covered with a tensily strained film 114. In this case, the tensily strained film 114 may be connected to the strained film 110 of the cell region. The tensily strained film 114 may cover surfaces of the source region 211, the drain region 215, and the gate electrode 213 of some NMOSs 210 among a plurality of NMOSs in the peripheral circuit region.

Figure 8:
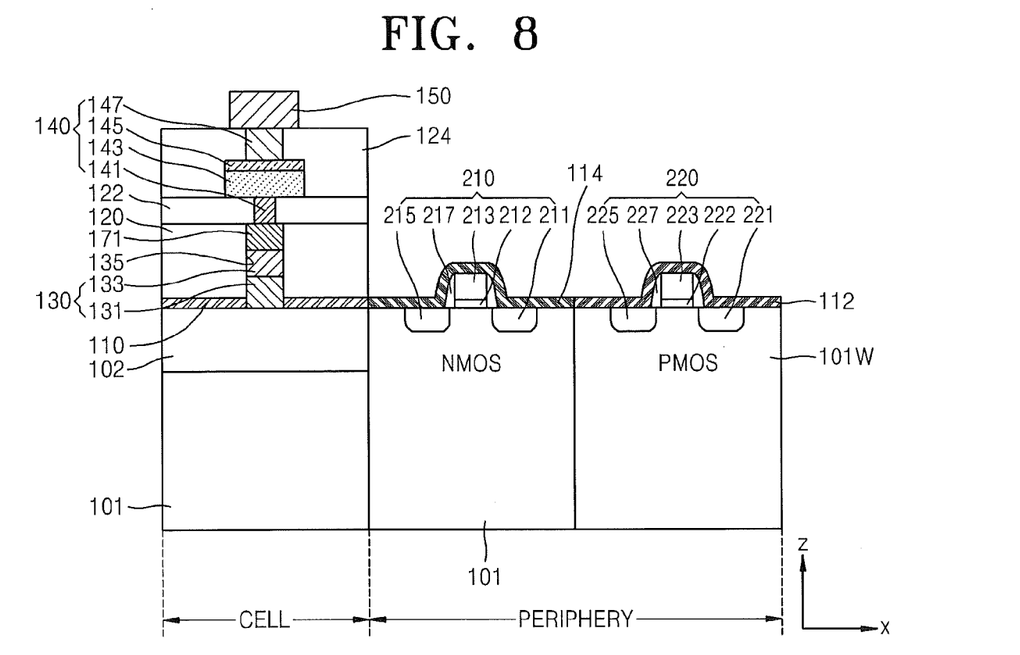

Alternatively, referring to FIG. 8, the compressively strained film 112 and the tensily strained film 114 may be formed on the surfaces of the PMOS 220 and the NMOS 210, respectively. The compressively strained film 112 may be connected to the strained film 110 of the cell region. Although not shown, instead of the compressively strained film 112, the tensily strained film 114 may be connected to the strained film 110 of the cell region. In other words, if the strained film 110 of the cell region is a compressively strained film, the strained film 110 of the cell region may be connected to the compressively strained film 112 of the PMOS 220, and, if the strained film 110 of the cell region is a tensily strained film, the strained film 110 of the cell region may be connected to the tensily strained film 114 of the NMOS 210. Furthermore, if the strained film 110 of the cell region is a compressively strained film and is connected to the compressively strained film 112 of the PMOS 220, the strained film 110 of the cell region may be separated from the tensily strained film 114 of the NMOS 210. If the strained film 110 of the cell region is a tensily strained film and is connected to the tensily strained film 114 of the NMOS 210, the strained film 110 of the cell region may be separated from the compressively strained film 112 of the PMOS 220.

Figure 9:
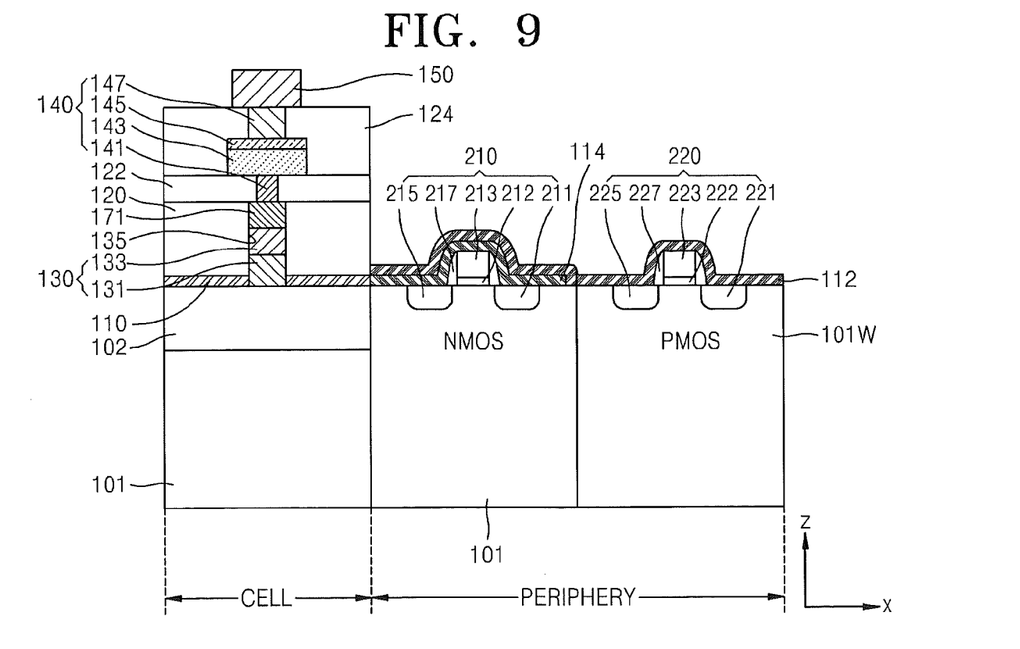
Figure 10:
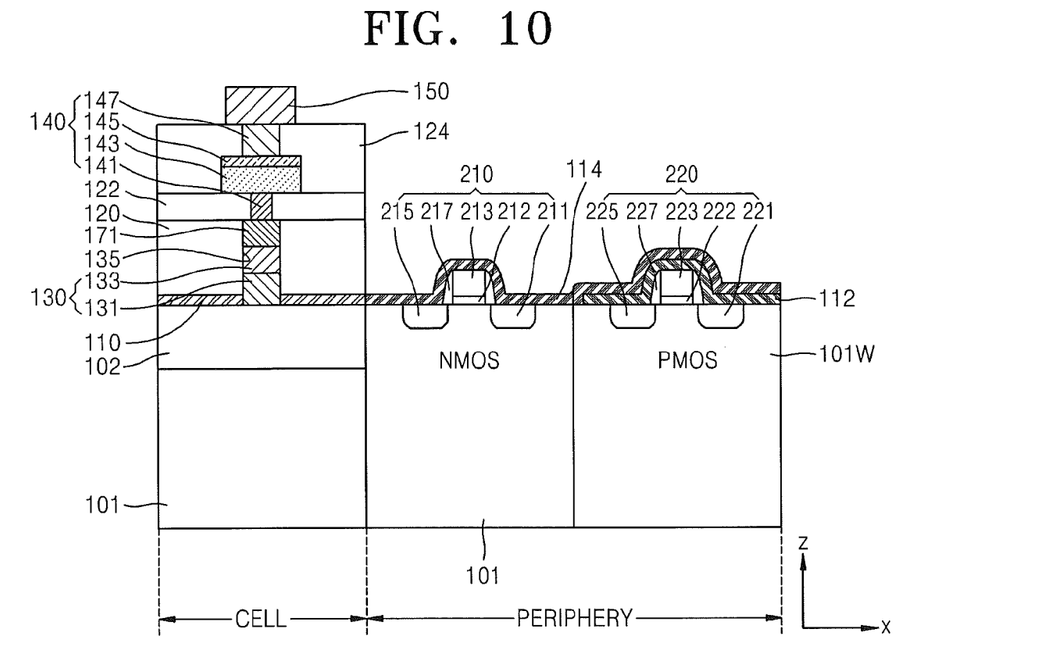

Alternatively, referring to FIG. 9, the tensily strained film 114 primarily covers the surface of the NMOS 210, and the compressively strained film 112 further covers the overall surfaces of the NMOS 210 and the PMOS 220. In this case, the surface of the NMOS 210 is covered with the tensily strained film 114 and the compressively strained film 112 disposed on the tensily strained film 114. To the contrary, referring to FIG. 10, the compressively strained film 112 primarily covers the surface of the PMOS 220, and the tensily strained film 114 further covers the overall surfaces of the NMOS 210 and the PMOS 220. In this case, the surface of the PMOS 220 is covered with the compressively strained film 112 and the tensily strained film 114 disposed on the compressively strained film 112.

Another embodiment of the inventive concept provides a method of manufacturing a semiconductor device, the method including forming a plurality of word lines on a semiconductor substrate, wherein the word lines are insulated from each other by a plurality of first insulation layers, extend in a first direction, and are arranged in a second direction different from the first direction, forming a strained film on the word lines and the first insulation layers, forming a second insulation layer formed on the strained film, forming a hole that passes through the second insulation layers and the strained film, forming a plurality of p-n junction diodes in the hole, wherein the p-n junction diodes include a first impurity region and a second impurity region that have different conductive types and are arranged perpendicular to each other, and are electrically connected to the word lines, forming a plurality of storage elements on the upper portions of the p-n junction diodes, and forming a plurality of bit lines on the upper portions of the storage elements.

Figure 11A:
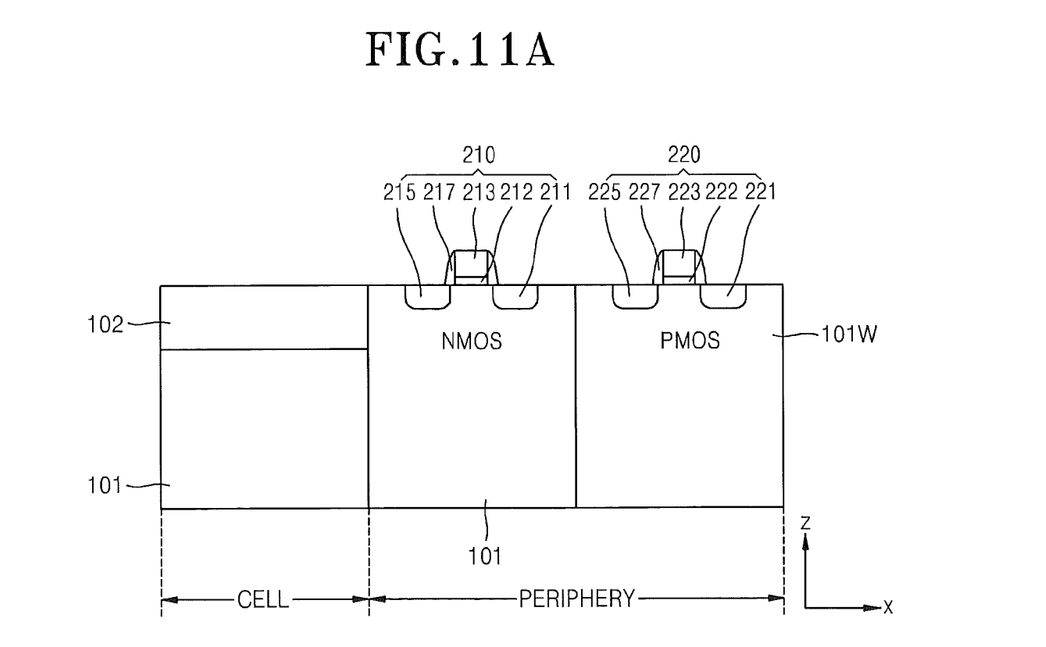
FIGS. 11A through 11C are cross-sectional views for explaining methods of manufacturing a semiconductor device and a semiconductor memory device, according to an embodiment of the inventive concept.
Figure 11B:
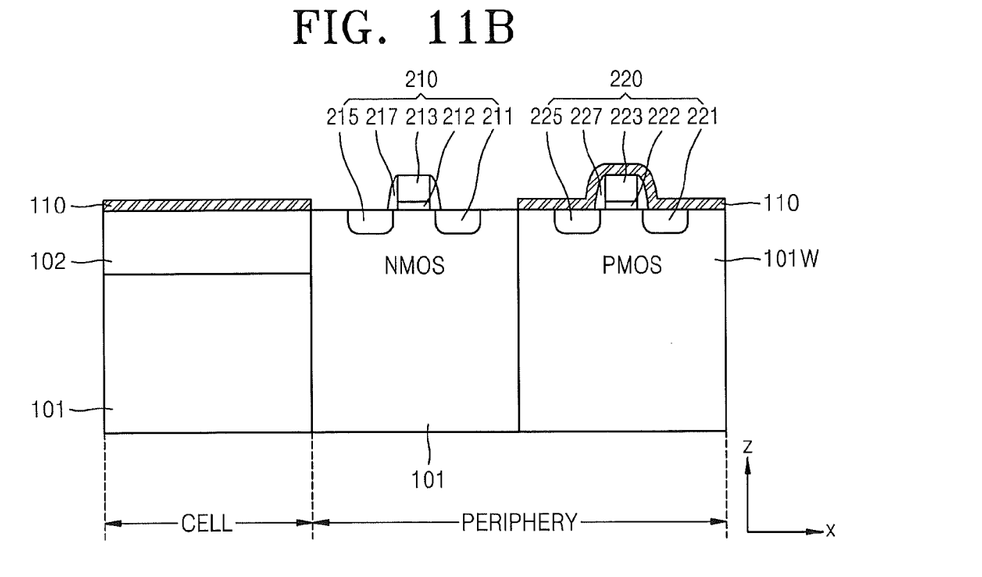
Figure 11C:
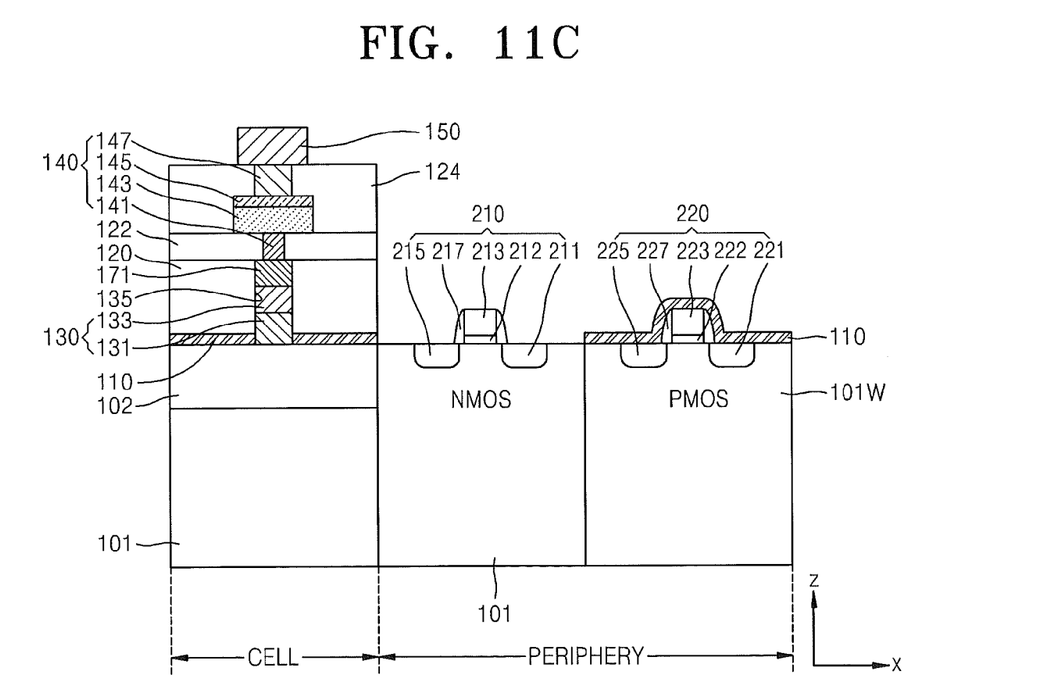

FIGS. 11A through 11C are cross-sectional views for explaining methods of manufacturing a semiconductor device and a semiconductor memory device according to an embodiment of the inventive concept. Referring to FIG. 11A, a semiconductor substrate 101 is provided to form a cell region and a peripheral circuit region. The NMOS 210 and/or the PMOS 220 may be formed in the peripheral circuit region. The NMOS 210 and the PMOS 220 may be formed using a conventional method, and thus its detailed description will not be repeated here. Furthermore, if the semiconductor substrate is a p-type semiconductor substrate, the n-well 101W may be formed in a region where the PMOS 220 is to be formed.

Furthermore, the first insulation layers 105 may be formed in the cell region and extend in a first direction (x direction) in order to partition a plurality of active regions arranged in a second direction that is different from the first direction. A dopant having an opposite conductive type to that of the semiconductor substrate 101 may be ion-injected in order to form the word lines $WL_1, WL_2, WL_3, \ldots, WL_m$ 102 in the active regions. A method of injecting ions in the dopant, ion injection energy, etc. may follow the conventional methods.

Referring to FIG. 11B, the strained film 110 is formed on the upper portions of the word lines $WL_1, WL_2, WL_3, \ldots, WL_m$ 102 and the first insulation layers 105. Although the strained film 110 is a compressively strained film in the present embodiment of the inventive concept, it will be understood by one of ordinary skill in the art that a tensily strained film may be similarly applied to the stained film 110. The strained film 110 may be formed to apply a tensile stress to the word lines $WL_1, WL_2, WL_3, \ldots, WL_m$ 102 and the first insulation layers 105.

Referring to FIG. 11C, a second insulation layer 120 is formed on the strained film 110. A hole 135 is formed to pass through the strained film 110 and the second insulation layer 120. The p-n junction diodes 130 may be formed in the hole 135 by sequentially and perpendicularly stacking the first impurity region 131 and the second impurity region 133 that have different conductive types. The first impurity region 131 and the second impurity region 133 may be formed in various ways. For example, the p-n junction diodes 130 may be provided by growing the regions of the first impurity region 131 and the second impurity region 133 from the word lines $WL_1, WL_2, WL_3, \ldots, WL_m$ 102 using selective epitaxial growth (SEG), injecting dopants having opposite conductive types to those of the word lines $WL_1, WL_2, WL_3, \ldots, WL_m$ 102 into the region of the second impurity region 133, and forming the second impurity region 133.

If the word lines $WL_1, WL_2, WL_3, \ldots, WL_m$ 102 are n types, the first impurity region 131 may be formed to have n type conductivity by diffusing dopants using the SEG. In this case, the second impurity region 133 may be formed by injecting p type dopants having a high density. If the word lines $WL_1, WL_2, WL_3, \ldots, WL_m$ 102 are p types, the first impurity region 131 may be formed to have p type conductivity by diffusing dopants using the SEG. In this case, the second impurity region 133 may be formed by injecting n type dopants having a high density.

Alternatively, the conductive plug 171 may be further disposed on the upper portion of the second impurity region 133 without wholly filling the hole 135 with the p-n junction diodes 130. The conductive plug 171 may be formed by forming a material layer to fill the inside of the hole 135 and performing, for example, chemical mechanical polishing (CMP) on the material layer. The material layer may be formed using physical vapor deposition (PVD) or chemical vapor deposition (CVD). However, the inventive concept is not limited thereto. Thereafter, the third insulation layer 122 is formed on the second insulation layer 120. The lower electrode 141 may be formed in the third insulation layer 122. The lower electrode 141 may be formed in a similar manner to the conductive plug 171 and thus its detailed description will not be repeated here.

A phase-change material film (not shown, corresponding to the phase-change material film 143) and an upper electrode (not shown, corresponding to the upper electrode 145) are formed on the lower electrode 141 and are patterned, so that a node is separated from cell to cell. The fourth insulation layer 124 and the bit line contact plug 147 are sequentially formed so that the storage element 140 may be formed. As described above, although PRAM is described as the storage element 140 in the present embodiment of the inventive concept, other storage elements such as MRAM, FRAM, PRAM, etc. may be used within the scope of the inventive concept.

Thereafter, a conductive layer (not shown, corresponding to the bit lines $BL_1, BL_2, \ldots, BL_i, BL_{(i+1)}, \ldots, BL_n$ 150) is formed on the upper portion of the storage element 140 so that the bit lines $BL_1, BL_2, BL_i, \ldots, BL_{(i+1)}, \ldots, BL_n$ 150 may be formed using patterning.

Another embodiment of the inventive concept provides an electronic device including the semiconductor device or the semiconductor memory device.

The electronic device includes a desktop computer, a portable computer, a tablet computer, a mobile phone, a portable multimedia player (PMP), a television set, an imaging device, an acoustic device, a household appliance, a portable storage device, a solid state drive (SSD), a medical device, and the like.

While the inventive concept has been particularly shown and described with reference to exemplary embodiments thereof, it will be understood that various changes in form and details may be made therein without departing from the spirit and scope of the following claims.

What is claimed is:

1. A semiconductor device, comprising:
   a semiconductor word line;
   an electrically insulating strain layer directly contacting a surface of said semiconductor word line, said electrically insulating strain layer having an opening therein and an internal compressive strain that imparts a net tensile stress within at least a first portion of said semiconductor word line that increases a conductivity of the first portion of said semiconductor word line by at least 5% relative to said semiconductor word line when said semiconductor word line is free of the tensile stress imparted by said electrically insulating strain layer; and
   a p-n junction diode having a first terminal electrically coupled through the opening in said electrically insulating strain layer to the surface of said semiconductor word line.

2. The device of claim 1, further comprising a data storage element having a current carrying terminal electrically coupled to a second terminal of said p-n junction diode.

3. The device of claim 1, wherein said electrically insulating strain layer comprises silicon nitride.

4. The device of claim 3, wherein said electrically insulating strain layer has a thickness in a range from 50 Å to 1000 Å.

5. The semiconductor device of claim 1, further comprising a peripheral circuit region having an n-channel metal oxide semiconductor (NMOS) transistor and/or a p-channel metal oxide semiconductor (PMOS) transistor therein.

6. The semiconductor device of claim 5,
wherein the NMOS transistor and/or the PMOS transistor comprises a source region, a drain region, and a gate region; and
wherein the electrically insulating strained layer extends to cover the source region, the drain region, and the gate region of at least one of the NMOS transistor and/or the PMOS transistor.

7. The semiconductor memory device of claim 6, further comprising an individual strained film covering the source region, the drain region, and the gate region of another one of the NMOS transistor and/or the PMOS transistor and separated from the electrically insulating strained layer.

8. The semiconductor device of claim 7, wherein the NMOS transistor is covered with a tensile strained film or the PMOS transistor is covered with a compressively strained film.

9. The semiconductor device of claim 7, wherein the NMOS transistor is covered with a tensile strained film and a compressively strained film is disposed on an upper portion of the tensile strained film.

10. The semiconductor device of claim 7, wherein the PMOS transistor is covered with a compressively strained film and a tensile strained film is disposed on an upper portion of the compressively strained film.

11. A semiconductor device, comprising:
a semiconductor word line having an electrically insulating strain layer directly contacting a surface thereof, said electrically insulating strain layer having an opening therein and an internal compressive strain that imparts a net tensile stress within at least a first portion of said semiconductor word line; and
a p-n junction diode having a first terminal electrically coupled through the opening in said electrically insulating strain layer to the surface of said semiconductor word line;
wherein said semiconductor word line is disposed within a semiconductor substrate and between first and second electrically insulating trench isolation regions that contact opposing sides of said semiconductor word line; and
wherein said electrically insulating strain layer contacts and imparts a net tensile stress within first and second portions of the first and second electrically insulating trench isolation regions, respectively.

12. The device of claim 11, further comprising a PMOS transistor having source and drain regions in a peripheral circuit portion of the semiconductor substrate; and wherein said electrically insulating strain layer contacts the source and drain regions at a surface of the semiconductor substrate.

13. The device of claim 11, further comprising a PMOS transistor having source and drain regions in a peripheral circuit portion of the semiconductor substrate; and wherein said electrically insulating strain layer covers the PMOS transistor to thereby impart a net tensile stress within a channel region of the PMOS transistor.

14. The device of claim 13, further comprising:
an NMOS transistor having source and drain regions in a peripheral circuit portion of the semiconductor substrate; and
a second electrically insulating strain layer covering the NMOS transistor, said second electrically insulating strain layer having a sufficiently high degree of internal tensile strain therein to thereby impart a net compressive stress within a channel region of the NMOS transistor.

15. A semiconductor device, comprising:
a semiconductor substrate having first and second electrically insulating trench isolation regions therein;
a semiconductor word line having an electrically insulating strain layer directly contacting a surface thereof, said electrically insulating strain layer having an opening therein and an internal compressive strain that imparts a net tensile stress within at least a first portion of said semiconductor word line that increases a conductivity of the first portion of said semiconductor word line by at least 5% relative to said semiconductor word line when said semiconductor word line is free of the tensile stress imparted by said electrically insulating strain layer;
wherein said semiconductor word line is disposed within the semiconductor substrate and between the first and second electrically insulating trench isolation regions that contact opposing sides of said semiconductor word line; and
wherein said electrically insulating strain layer contacts and imparts a net tensile stress within first and second portions of the first and second electrically insulating trench isolation regions, respectively.

16. The device of claim 15, further comprising a p-n junction diode having a first terminal electrically coupled through the opening in said electrically insulating strain layer to the surface of said semiconductor word line.

* * * * *